(12) United States Patent
Thaploo et al.

(10) Patent No.: US 10,410,699 B1
(45) Date of Patent: Sep. 10, 2019

(54) MULTI-BIT PULSED LATCH INCLUDING SERIAL SCAN CHAIN

(71) Applicant: Intel Corporation, Santa Clara, CA (US)

(72) Inventors: Anupama A. Thaploo, Folsom, CA (US); Bhushan Borole, Rancho Cordova, CA (US); Muhammad M. Khellah, Tigard, OR (US); Pascal A. Meinerzhagen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/024,441

(22) Filed: Jun. 29, 2018

(51) Int. Cl.
*G11C 7/22* (2006.01)
*G01R 31/3185* (2006.01)

(52) U.S. Cl.
CPC ...... *G11C 7/222* (2013.01); *G01R 31/318541* (2013.01); *G11C 7/225* (2013.01); *G11C 7/227* (2013.01)

(58) Field of Classification Search
None
See application file for complete search history.

(56) References Cited

U.S. PATENT DOCUMENTS

| | | | | | |
|---|---|---|---|---|---|
| 5,457,698 | A * | 10/1995 | Segawa | .......... | G01R 31/318541 714/731 |
| 5,748,645 | A * | 5/1998 | Hunter | .......... | G01R 31/318552 714/726 |
| 6,453,436 | B1 * | 9/2002 | Rizzolo | .......... | G01R 31/318525 714/726 |
| 7,501,850 | B1 * | 3/2009 | Correale, Jr. | ... | G01R 31/318541 326/16 |
| 7,596,732 | B2 * | 9/2009 | Branch | .......... | G01R 31/318544 327/202 |
| 8,860,463 | B1 * | 10/2014 | Qureshi | .......... | H03K 19/017581 326/121 |
| 9,291,674 | B1 * | 3/2016 | Lu | .......... | G01R 31/3177 |
| 9,406,375 | B1 * | 8/2016 | Barowski | .......... | G11C 11/418 |
| 2004/0041610 | A1 * | 3/2004 | Kundu | .......... | G01R 31/318541 327/215 |
| 2006/0041802 | A1 * | 2/2006 | Grise et al. | ... | G01R 31/318541 714/724 |
| 2013/0169331 | A1 * | 7/2013 | Jain | .......... | H03K 3/0375 327/199 |

(Continued)

*Primary Examiner* — Cassandra F Cox
(74) *Attorney, Agent, or Firm* — Schwegman Lundberg & Woessner, P.A.

(57) ABSTRACT

Some embodiments include apparatuses having a plurality of latches, each of the latches including a first input node to receive first information during a first mode of the apparatus, a second input node to receive second information during a second mode of the apparatus, a first clock node to receive a first signal, a second clock node to receive a second signal, a third clock node to receive a third signal, and a fourth clock node to receive a fourth signal; a first conductive connection coupled between an output node of a first latch among the latches and the first input node of a second latch among the latches; a second conductive connection coupled between an output node of the second latch and the first input node of a third latch among the latches; and a third conductive connection coupled between an output node of the third latch and the first input node of a fourth latch among the latches.

19 Claims, 6 Drawing Sheets

(56) References Cited

U.S. PATENT DOCUMENTS

2016/0133336 A1* 5/2016 Lim .................. G11C 19/28
                                            365/230.03
2016/0259001 A1* 9/2016 Corso ............... G01R 31/3177

* cited by examiner

MULTI-BIT PULSED LATCH INCLUDING SERIAL SCAN CHAIN

TECHNICAL FIELD

Embodiments described herein pertain to data transfer and storage in electronic devices and systems. Some embodiments relate to latch circuitry in such devices and systems.

BACKGROUND

Sequential cells such as flip-flops and latches are used in many electronic devices and systems such as processors, memory devices, and other electronic items. In some conventional techniques, multiple sequential cells (e.g, multiple flip-flops or latches) are arranged in a group and use a common clock signal to control the timing of data transfer from one part of the sequential cell to another part of the sequential cell. Such grouping of the sequential cells is designed to reduce power consumption of the sequential cells. However, some devices and systems may have a certain power consumption specifications that even sequential cells designed by such conventional techniques may be unable to meet.

DETAILED DESCRIPTION

The techniques described herein include improved latches and an internal chain (e.g, scan chain) formed by the latches. The described techniques also include pulse generators to generate separate signals that can be used as timing signals (e.g, clock or pulse signals) for the latches. The latches including the internal chain can operate in a test mode and a normal mode. The chain can be deactivated during the normal mode to reduce power consumption by the latches. Other improvements and benefits associated with the described techniques are discussed below with reference to FIG. 1 through FIG. 6.

Figure 1:
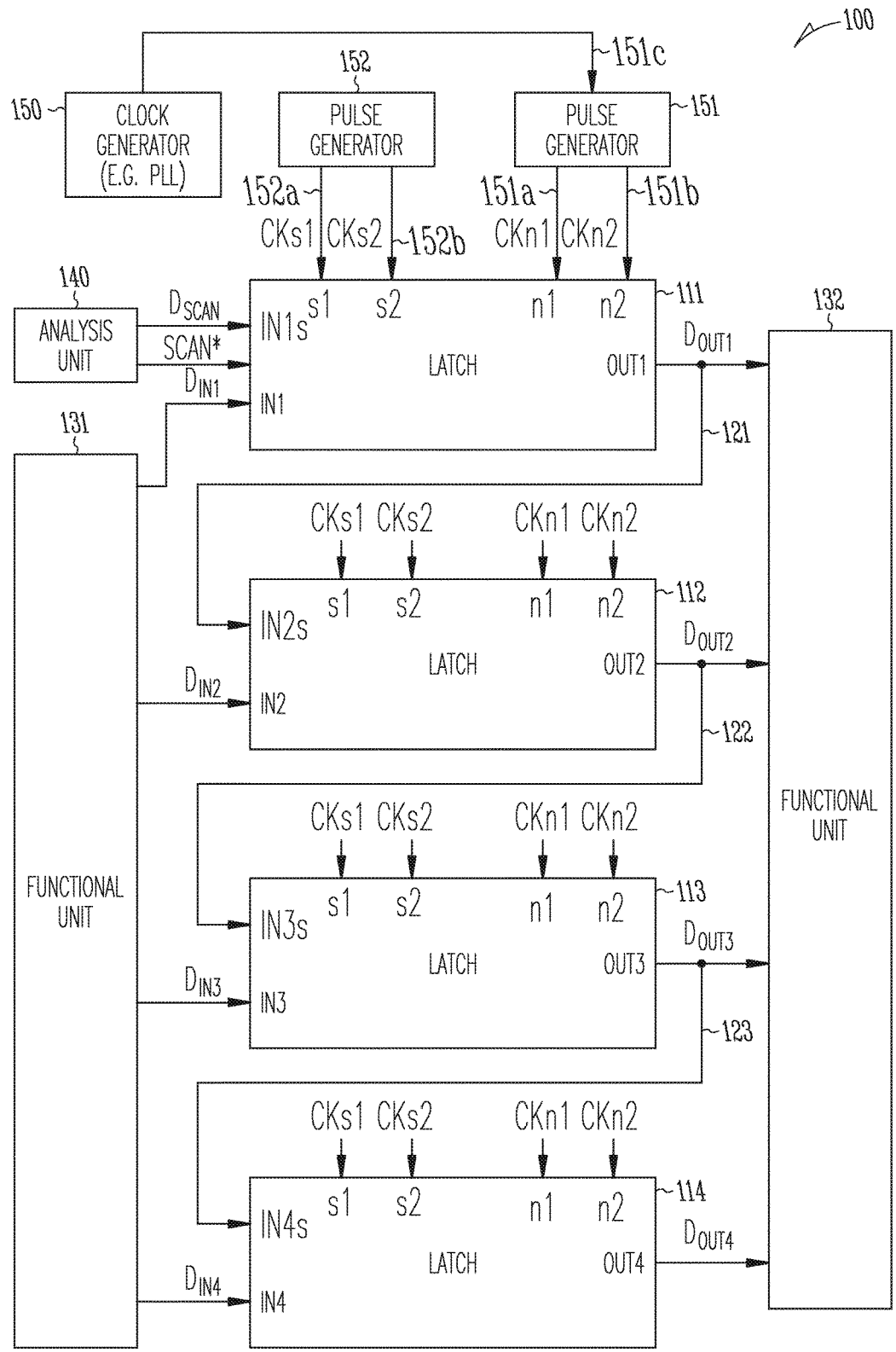
FIG. 1 shows an apparatus including latches, according to some embodiments described herein.

FIG. 1 shows an apparatus 100 including latches 111, 112, 113, and 114, according to some embodiments described herein. Apparatus 100 can include or be included in an electronic device (e.g, a graphics processor, a general-purpose processor, a system-on-chip (SoC), or other electronic chips and devices) or system, such as a computer (e.g, desktop, laptop, or notebook), a tablet, a cellular phone, wearable electronics (e.g, smart watches), or other electronic devices or systems. Latches 111, 112, 113, and 114 can form a multi-bit pulsed latch.

As shown in FIG. 1, latches 111, 112, 113, and 114 (111-114) have respective input nodes (e.g, data input nodes) IN1, IN2, IN3, and IN4, respective input nodes (e.g, scan input nodes) IN1$s$, IN2$s$, IN3$s$, and IN4$s$, and respective output nodes (e.g, data output nodes) OUT1, OUT2, OUT3, and OUT4. Apparatus 100 can include a conductive connection 121 coupled between output node OUT1 and input node IN2$s$, a conductive connection 122 coupled between output node OUT2 and input node IN3$s$, and a conductive connection 123 coupled between output node OUT3 and input node IN4$s$.

Conductive connections 121, 122, and 123 can be part of a chain (e.g, a scan chain) that electrically couple latches 111-114. For example, the chain can electrically couple latch 111 to latch 112 through conductive connection 121, electrically couple latch 112 to latch 113 through conductive connection 122, and electrically couple latch 113 to latch 114 through conductive connection 123.

Apparatus 100 can be configured to operate in a test mode (e.g, scan mode) and a normal mode. The chain (formed by latches 111-114 and conductive connections 121, 122, and 123) can be activated during a test mode of apparatus 100 to allow testing (e.g, scanning in and out test vectors).

Apparatus 100 can include analysis unit 140, which can include circuitry to allow testing of apparatus 100 during a test mode. Analysis unit 140 can operate to place apparatus 100 in a test mode. Alternatively, or additionally, a control unit (not shown) of apparatus 100 can also place apparatus 100 in a test mode. FIG. 1 shows an example where analysis unit 140 is located in apparatus 100 (e.g, located on a same semiconductor die with latches 111-114). However, a portion of analysis unit 140 or the entire analysis unit 140 can be located outside apparatus 100 (e.g, located on test equipment separated from apparatus 100).

As shown in FIG. 1, analysis unit 140 can provide a signal SCAN* and information (e.g, test data) Dscan to latch 111. Signal SCAN* can have different values (e.g, values corresponding to binary zero ("0") and binary one ("1")) at different times. Latches 111-114 can operate in a test mode if signal SCAN* has one value (e.g, "0") and in a normal mode if signal SCAN* has another value (e.g, "1"). Information Dscan can be provided to node IN1$s$ of latch 111 during a test mode. Then, information Dscan can be passed (e.g, serially passed) from latch 111 to latch 112 through conductive connection 121, from latch 112 to latch 113 through conductive connection 122, and from latch 113 to latch 114 through conductive connection 123. Information Dscan can also be passed to output nodes OUT1, OUT2, OUT3, and OUT4 (as information (e.g, output data) Dout1, Dout2, Dout3, and Dout4, respectively) when information Dscan is passed from latch 111 to latch 114 through the chain (formed by latches 111-114 and conductive connections 121, 122, and 123.

During a normal mode of apparatus 100, latches 111, 112, 113, and 114 of FIG. 1 can operate to receive information (e.g, input data) Din1, Din2, Din3, and Din4, respectively, and pass information Din1, Din2, Din3, and Din4 to nodes OUT1, OUT2, OUT3, and OUT4, respectively, as information Dout1, Dout2, Dout3, and Dout4, respectively. Latches 111-114 can concurrently receive (e.g, receive in parallel) information Din1, Din2, Din3, and Din4, respectively. Latches 111-114 can concurrently provide (e.g, provide in parallel) information Dout1, Dout2, Dout3, and Din4, respectively.

Apparatus 100 can include a functional unit 131 to provide information Din1, Din2, Din3, and Din4 to latches 111, 112, 113, and 114, respectively, and a functional unit 132 to receive information Dout1, Dout2, Dout3, and Dout4 from latches 111, 112, 113, and 114, respectively. Latches 111-114 can be part of a data path of apparatus 100. Functional unit 132 can perform an operation on information Dout1, Dout2, Dout3, and Dout4 or provide information Dout1, Dout2, Dout3, and Dout4 to another unit (not shown) of apparatus 100 for further processing. Functional units 131 and 132 can be part of a data path of a processing unit of apparatus 100. For example, apparatus 100 can include a processor (e.g., a general-purpose processor or a graphics processor) in which functional units 131 and 132 can be part of a data path in a processing core of the processor.

As shown in FIG. 1, each of latches 111-114 can include nodes (e.g., clock input nodes) n1, n2, s1, and s2 to receive signals (e.g., clock pulses) CKn1, CKn2, CKs1, and CKs2, respectively. Latches 111-114 receive the same signals CKn1, CKn2, CKs1, and CKs2.

Signals CKs1 and CKs2 can be generated during a test mode of apparatus 100 and can be deactivated during a normal mode of apparatus 100. Signals CKn1 and CKn2 can be generated during both the test mode and the normal mode of apparatus 100. During the test mode, signals CKn1, CKn2, CKs1, and CKs2 can be used as timing signals (e.g., clock or pulse signals) to control the propagation of information Dscan from latch 111 to latch 114. During the normal mode, signals CKn1 and CKn2 can be used to control the propagation of information Din1, Din2, Din3, and Din4 from notes IN1, IN2, IN3, and IN4, respectively, to nodes OUT1, OUT2, OUT3, and OUT4, respectively.

Apparatus 100 can include a clock generator 150 to generate a clock signal CLK, and pulse generators 151 and 152. Clock generator 150 in FIG. 1 can include a phase-lock loop (PLL) to generate clock signal CLK. Apparatus 100 can include a clock distribution network (e.g., a clock tree) between clock generator 150 and pulse generators 151 and 152. However, such a clock distribution network is omitted from FIG. 1 for simplicity. Clock generator 150 and pulse generators 151 and 152 can be part of a clock path of apparatus 100. Pulse generator 151 can include an input node 151c to receive clock signal CLK and generate signals CKn1 and CKn2 at output nodes 151a and 151b, respectively, based on clock signal CLK. Pulse generator 152 can generate signals CKs1 and CKs2 at output nodes 152a and 152b, respectively, based on signals from pulse generator 151 (described in more detail with reference to FIG. 3).

As mentioned above, latches 111-114 can form a multi-bit pulsed latch. Alternatively, pulse generator 151 and 152 can also be part of the multi-bit pulsed latch. Thus, the multi-bit pulsed latch described herein can include either latches 111-114 or a combination of latches 111-114 and pulse generators 151 and 152. FIG. 1 shows an example where the multi-bit pulsed latch includes four latches (e.g., latches 111-114). However, the multi-bit pulsed latch can include a different number of latches coupled in ways similar to those of latches 111-114. For example, the multi-bit pulsed latch can include 8, 16, 32, or another number of latches.

As mentioned above, apparatus 100 can be included in an electronic device (e.g., a processor). One of ordinary skill in the art may recognize that such a device includes other components and circuitry, several of which are not shown in FIG. 1 so as not to obscure the example embodiments described herein. Details of the circuitry and operations of latches 111-114 are described below with reference to FIG. 2 through FIG. 5.

Figure 2:
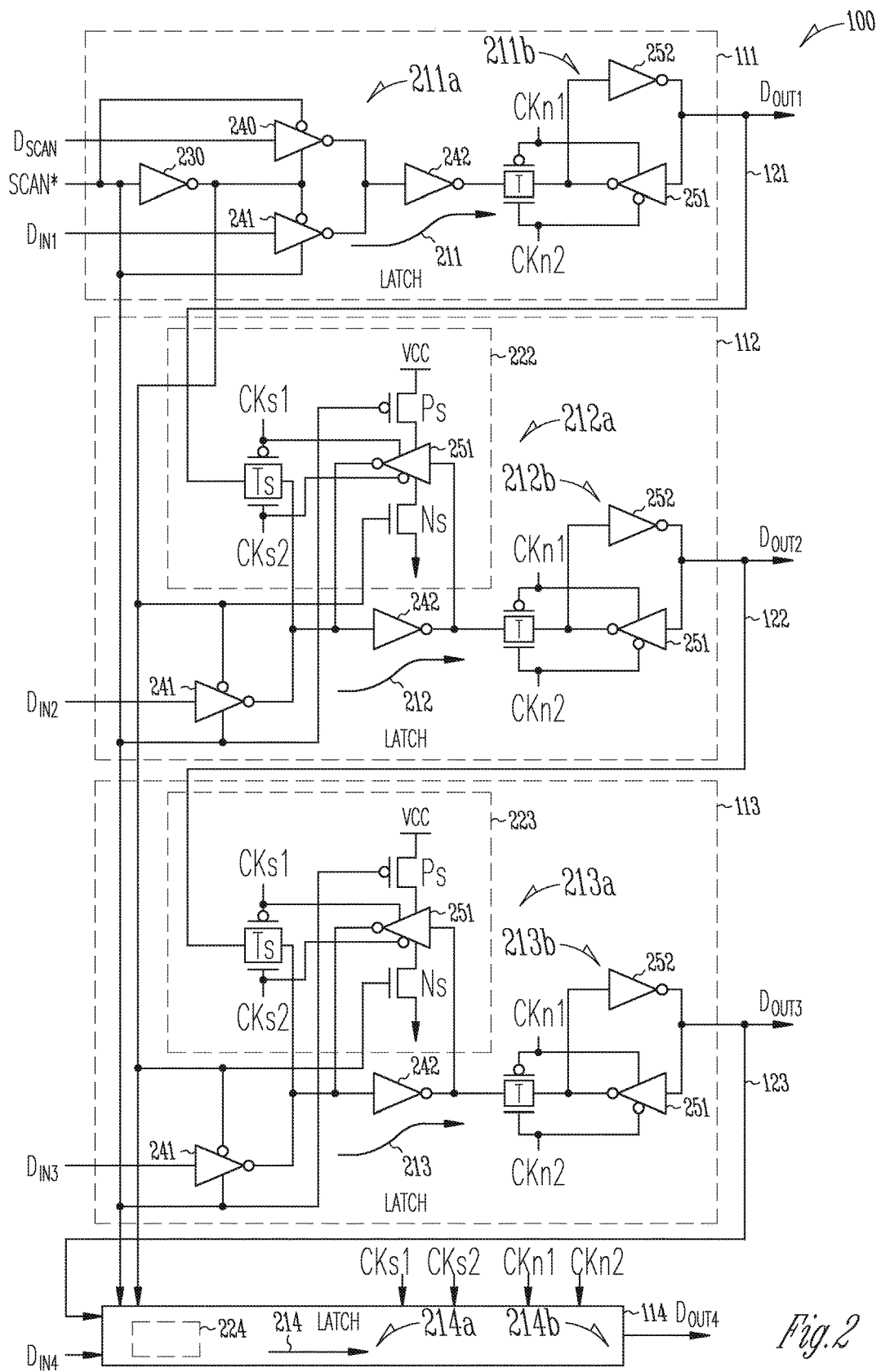
FIG. 2 shows details of the latches of FIG. 1, according to some embodiments described herein.

FIG. 2 shows details of latches 111, 112, and 113 of FIG. 1, according to some embodiments described herein. Latch 114 includes elements similar to or identical to those of each of latches 112 and 113. For simplicity, FIG. 2 omits the details of latch 114. FIG. 2 omits some of the labels that are shown in FIG. 1, such as labels for nodes IN1, IN2, IN3, IN4, IN1s, IN2s, IN3s, and IN4s (input nodes), OUT1, OUT2, OUT3, and OUT4 (output nodes), and n1, n2, s1, and s2 (clock nodes) shown in FIG. 1.

As shown in FIG. 2, latches 111-114 can include circuit paths 211, 212, 213, and 214, respectively. During a normal mode of apparatus 100, circuit paths 211, 212, 213, and 214 can operate to pass respective information Din1, Din2, Din3, and Din4 to respective output nodes of latches 111-114 as information Dout1, Dout2, Dout3, and Dout4. During a test mode of apparatus 100, circuit paths 211, 212, 213, and 214 can operate to pass information Dscan from latch 111 to latch 114. As described below, each of latches 111-114 can include an input stage and an output stage included in a respective circuit path among circuit paths 211, 212, 213, and 214.

In the following description and as is known to those skilled in the art, "CMOS" refers to complementary metal-oxide semiconductor. "NMOS" transistor" refers to an n-channel metal-oxide semiconductor (MOS) transistor. "PMOS transistor" refers to a p-channel metal-oxide semiconductor transistor. A transmission gate can include a combination of PMOS and NMOS transistors. A tri-state inverter can include a CMOS inverter.

As shown in FIG. 2, latch 111 can include an input stage 211a and an output stage 211b located on circuit path 211. Input stage 211a can include inverters (e.g., tri-state inverters) 240 and 241, and an inverter (e.g., CMOS inverter) 242. Output stage 211b can include a transmission gate T, an inverter (e.g., tri-state inverter) 251, and an inverter 252.

During a test mode, inverter 241 can be deactivated, and inverter 240 can be activated (e.g., turned on) to receive information Dscan and pass it to output stage 211b. Thus, during the test mode, the information received at input stage 211a is based on information Dscan. During a normal mode of apparatus 100, inverter 240 can be deactivated, and inverter 241 can be activated (e.g., turned on) to receive information Din1 and pass it to output stage 211b. Thus, during the normal mode, information received at input stage 211a is based on information Din1. Therefore, inverters 240 and 241 of latch 111 can form part of a multiplexer, which can be controlled by signal SCAN*, to pass either information Dscan (e.g., during a test mode) or information Din1 (e.g., during a normal mode) to output stage 211b of latch 111.

Transmission gate T can operate during both a test mode and a normal mode of apparatus 100. Transmission gate T can operate (e.g., turn on or turn off) based on timing of signals CKn1 and CKn2 to pass information received from input stage 211a to output stage 211b. The information received at input stage 211a can be either information Dscan (e.g., in a test mode) or information Din1 (e.g., in a normal mode).

For simplicity, similar or identical elements among latches 111-114 are given similar labels. For example, latches 112, 113, and 114 can include respective input stages 212a, 213a, and 214a, and respective output stages 212b, 213b, and 214b. Like output stage 211b of latch 111, each of respective output stages 212b, 213b, and 214b of latches 112, 113, and 114 can include a transmission gate T, and inverters 251 and 252. Unlike input stage 211a of latch 111, input stages 212a, 213a, and 214a can include respective circuits (e.g, time delay control circuits) 222, 223, and 224 instead of inverter 240 as in latch 111.

Circuits 222, 223, and 224 can be part of the chain (e.g., the scan chain mentioned above) from latch 111 to latch 114. Circuits 222, 223, and 224 can be activated (e.g., turned on) during a test mode of apparatus 100 and deactivated (e.g., turned off) during a normal mode (e.g., a non-test mode) of apparatus 100. Thus, during the normal mode, circuits 222, 223, and 224 consume no or minimal active power because they are deactivated. This can improve (e.g., reduce) power consumption of latches 111-114 during the normal mode.

During the test mode of apparatus 100, circuit 222 can be activated (e.g., turned on) to receive information Dscan from latch 111 and pass it to output stage 212b, circuit 223 can be activated (e.g., turned on) to receive information Dscan from latch 112 and pass it to output stage 213b, and circuit 224 can be activated (e.g., turned on) to receive information Dscan from latch 113 and pass it to output stage 214b. As mentioned above, inverter 241 in each of latches 112, 112, and 114 can be deactivated (e.g., turned off) during the test mode. Thus, the information received at input stage 211a, 212a, 213a, and 214a (received by inverter 240 and circuits 222, 223, and 224, respectively) is based on information Dscan received during the test mode.

During a normal mode of apparatus 100, inverter 241 in each of latches 112, 113, and 114 can be activated (e.g., turned on) to receive information Din2, Din3, and Din4, respectively, and pass it to respective output stage 212b, 213b, or 214b. As mentioned above, circuits 222, 223, and 224 can be deactivated (e.g., turned off) during the normal mode. Thus, the information received at input stage 211a, 212a, 213a, and 214a (received by inverter 241 of each of latches 111, 112, 113, and 114, respectively) is based on information Din1, Din2, Din3, and Din4, respectively, during the normal mode.

Thus, circuit 222 and inverter 241 of latch 112 can form part of a multiplexer, which can be controlled by signal SCAN*, to pass either information Dscan (e.g., during a test mode) or information Din2 (e.g., during a normal mode) to output stage 212b of latch 112. Circuit 223 and inverter 241 of latch 113 can form part of a multiplexer, which can be controlled by signal SCAN*, to pass either information Dscan (e.g., during a test mode) or information Din3 (e.g., during a normal mode) to output stage 213b of latch 113. Similarly, circuit 224 and inverter 241 (not shown) of latch 114 can form part of a multiplexer, which can be controlled by signal SCAN*, to pass either information Dscan (e.g., during a test mode) or information Din4 (e.g., during a normal mode) to output stage 214b of latch 114.

As shown in FIG. 2, each of circuits 222, 223, and 224 can include a transistor (e.g., PMOS transistor) Ps, a transistor (e.g., NMOS transistor) Ns, an inverter (e.g., a tri-state inverter) 251, and a transmission gate Ts. Voltage Vcc coupled to transistor Ts can be a supply voltage (e.g., supply voltage Vcc of apparatus 100 of FIG. 1). Transistors Ns and Ps in each of circuits 222, 223, and 224 can be controlled (e.g., turned on or turned off) based on signal SCAN* to activate or deactivate circuits 222, 223, and 224. Transmission gate Ts in each of circuits 222, 223, and 224 can be controlled (e.g., turned on or turned off) based on timing of signals CKs1 and CKs2. For example, during a test mode, transmission gate Ts can be turned on to pass information Dscan from a respective input stage (among input stages 212a, 213a, and 214a) to a respective output stage (among output stages 212b, 213b, and 214b). Transmission gate Ts can be turned off during a normal mode.

As shown in FIG. 2, apparatus 100 can include an inverter 230 to receive signal SCAN*. FIG. 2 shows inverter 230 being part of latch 111 as an example. However, inverter 230 can be outside latch 111 (e.g., can be part of analysis unit 140 (FIG. 1) or part of another circuit of apparatus 100). Signal SCAN* (at the input node of inverter 230) and the signal (not labeled) at the output node of inverter 230 can be used to control input stage 211a, 212a, 213a, and 214a of respective latches 111-114.

For example, during a test mode, signal SCAN* can be activated, such that it can have a value (e.g., SCAN*="0") to activate (e.g., turn on) inverter 240 (of latch 111) and circuits 222, 223, and 224 (of respective latches 112, 113, and 114). As described above, inverter 241 of each of latches 111-114 can be deactivated (e.g., turned off) during a test mode. Thus, in a test mode, information Dscan can be passed from latch 111 to latch 114 because inverter 240 and circuits 222, 223, and 224 are activated (e.g., turned on).

During a normal mode, signal SCAN* can be deactivated, such that it can have a value (e.g., SCAN*="1") to deactivate (e.g., turn off) inverter 240 (of latch 111) and circuits 222, 223, and 224 (of respective latches 112, 113, and 114). Inverter 241 of each of latches 111-114 is activated (e.g., turned on) during a normal mode. As described above, information Din1, Din2, Din3, and Din4 can be passed from respective input stages of latches 111-114 to respective output stages of latches 111-114. Information Din1, Din2, Din3, and Din4 is not passed from one latch to another latch (e.g., from latch 111 to latch 112, from latch 112 to latch 113, or from latch 113 to latch 114) because circuits inverter 240 and 222, 223, and 224 are deactivated (e.g., turned off).

As described above, circuits 222, 223, and 224 can be concurrently activated (e.g, when SCAN*="0") during a test mode of apparatus 100 or can be concurrently deactivated (e.g, when SCAN*="1") during a normal mode of apparatus 100.

Inverters 241 of latches 111-114 can be controlled by the same signal (e.g., same phase of signal SCAN*). Thus, inverters 241 of latches 111-114 can be concurrently activated (e.g, when SCAN*="1") during a normal mode of apparatus 100 or can be concurrently deactivated (e.g, when SCAN*="0") during a test mode of apparatus 100.

Transmission gate Ts of each of circuits 222, 223, and 224 can be controlled by the same signals (e.g., same phase of signal CKs1 and same phase of signal CKs2). Thus, transmission gate Ts of each of circuits 222, 223, and 224 can be concurrently activated (e.g, when SCAN*="0") during a test mode of apparatus 100 or can be concurrently deactivated (e.g, when SCAN*="1") during a normal mode of apparatus 100.

Transmission gate T of each of latches 111-114 can be controlled by the same signals (e.g., same phase of signal CKn1 and same phase of signal CKn2). Thus, transmission gate T of latches 111-114 can be concurrently activated (e.g., when SCAN*="1") during a normal mode of apparatus 100 or can be concurrently activated (e.g., when SCAN*="0") during a test mode of apparatus 100.

Signals CKn1, CKn2, CKs1, and CKs2 can be generated based on clock signal CLK. Latches 111-114 can use signals CKn1, CKn2, CKs1, and CKs2 as timing signals to pass information (e.g., either Dscan or Din1, Din2, Din3, and Din4) from respective input stage 211a, 212a, 213a, 214a to respective output stage 211b, 212b, 213b, 214b of each of latches 111-114.

Figure 3:
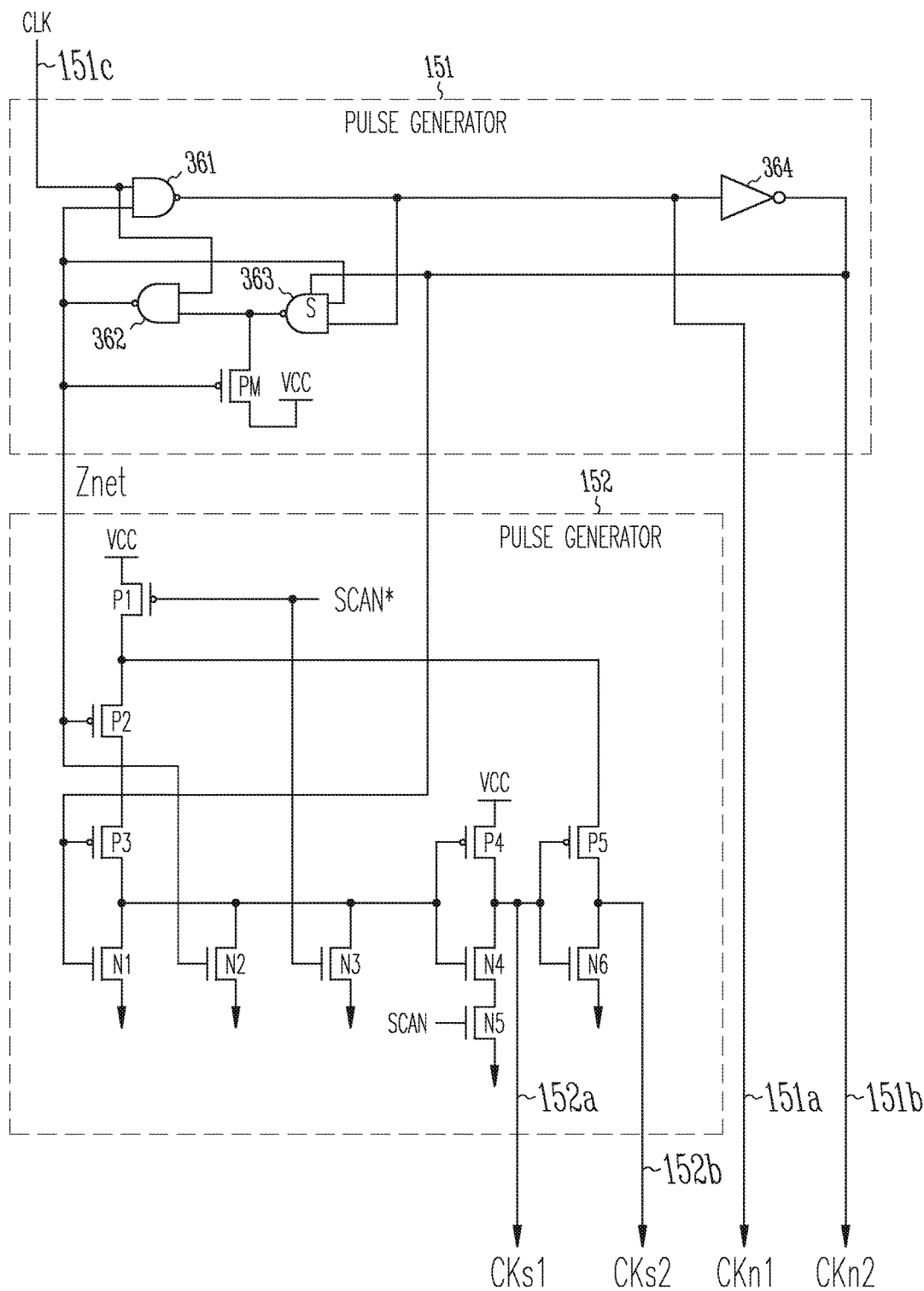
FIG. 3 shows a schematic diagram of pulse generators of the apparatus of FIG. 1, according to some embodiments described herein.

FIG. 3 shows a schematic diagram of pulse generators 151 and 152 of FIG. 1, according to some embodiments described herein. As shown in FIG. 3, pulse generator 151 can receive clock signal CLK at input node 151c. As described above, clock signal CLK can be generated (e.g, generated by a PLL) by clock generator 150 (FIG. 1). Clock signal CLK can be a periodical clock signal and can have a 50% duty cycle.

Pulse generator 151 can operate to generate signals CKn1 and CKn2 at its output nodes 151a and 151b, respectively, based on clock signal CLK. Pulse generator 152 can generate signals CKs1 and CKs2 at its output nodes 152a and 152b, respectively. Signals CKn1 and CKn2 can have duty cycles such that the time interval for which a portion (e.g., transmission gate T) of output stages 211b, 212b, 213b, and 214b is turned on (e.g., activated) can be less than the time interval for which such a portion is turned off (e.g., deactivated). Signal CKn2 can have a duty cycle different from 50%. For example, signal CKn2 can have a duty cycle less than 50%, such as 10%. Signal CKn2 can be a complement of signal CKn1.

As shown in FIG. 3, pulse generator 151 can include logic gates (e.g., NAND gates) 361, 362, and 363, a transistor (e.g., PMOS transistor) PM, and an inverter 364, coupled as shown in FIG. 3 to generate signals CKn1, CKn2, and Znet. Voltage Vcc in FIG. 3 can be a supply voltage of apparatus 100 (FIG. 1).

In FIG. 3, pulse generator 151 can operate to stretch the pulse width of signal CKn2 for latch write-ability at low overhead. For example, in addition to taking the feedback from signal CKn1 (at the input node of inverter 364) for termination of the pulse generated by signal CKn2, a delayed version of signal CKn1 (which is signal CKn2) is also fed into the source terminal (labeled "S" at gate 363) of a PMOS transistor (inside gate 363) driven by signal CKn1. This feedback technique is performed so that the pulse generated by signal CKn2 can only be terminated after signal CKn2 transitions to high (e.g., after the level of signal CKn2 has a value corresponding to "1"). The inclusion of transistor PM allows pulse generator 151 to avoid floating the output node of gate 363 after signal CKn2 makes a transition from high to low (e.g., a transition from a level corresponding to "1" to a level corresponding to "0"). Other circuit techniques to stretch the pulse width of signal CKn2 can be used, such as inserting delay elements (e.g., buffers) on one or several internal circuit nodes of pulse generator 151.

Pulse generator 152 can operate to generate signal CKs1 and CKs2 based on signals CKn2 and Znet (generated by pulse generator 151), such that signals CKn2 and CKs2 are non-overlapping signals. Each of signals CKs1 and CKs2 can have a duty cycle different from 50%. Signal CKs2 can be a complement of signal CKs1. As described above with reference to FIG. 1 and FIG. 2, signals CKs1 and CKs2 can be used as timing signals (e.g., clock or pulse signals) to control (e.g., turn on or turn off) a portion of circuits 222, 223, and 224 of input stages 212a, 213a, and 214a of latches 112, 113, and 114, respectively.

As shown in FIG. 3, pulse generator 152 can include transistors (e.g., PMOS transistors) P1, P2, P3, P4, and P5 and transistors (e.g., NMOS transistors) N1, N2, N3, N4, N5, and N6 coupled as shown in FIG. 3 to generate signal CKs1 and CKs2. Transistor N5 can be used to reduce leakage. Signal SCAN at the gate of transistor N5 is an inverted version of signal SCAN*. Thus, signal SCAN can be the same as the signal at the output of inverter 230 of FIG. 2.

Figure 4:
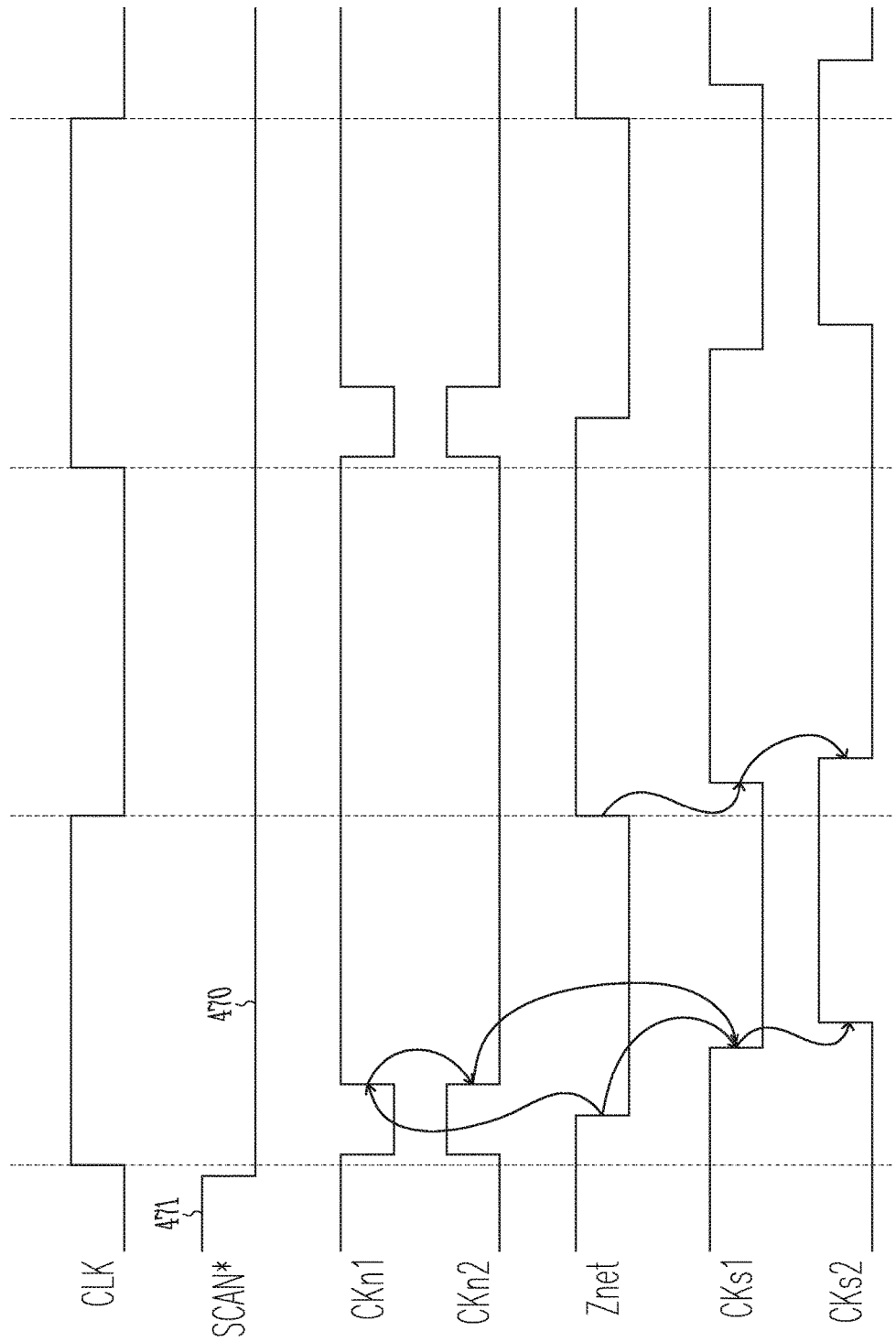
FIG. 4 shows a timing diagram for some of the signals of the pulse generators of FIG. 3 during a test mode, according to some embodiments described herein.
Figure 5:
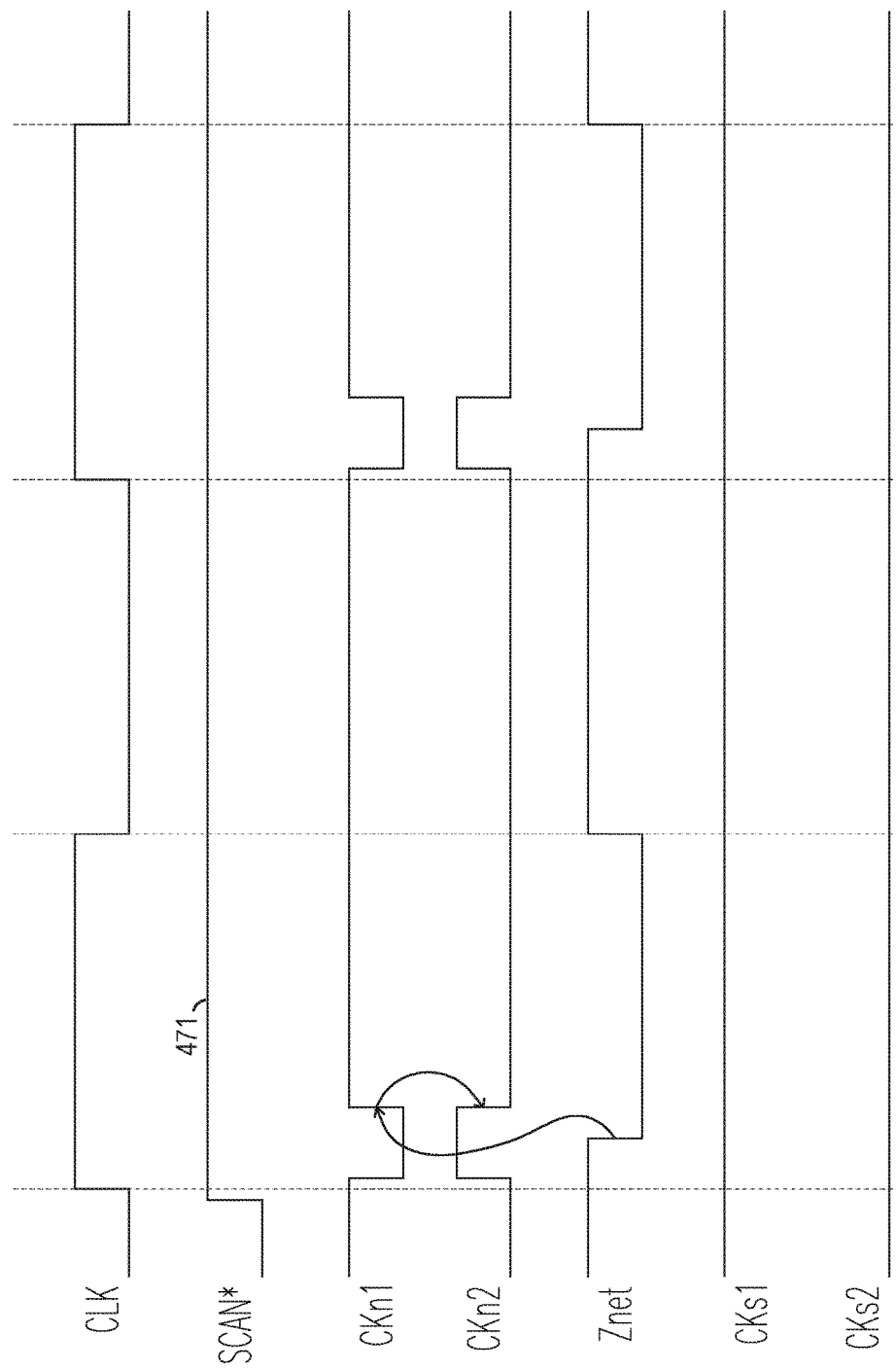
FIG. 5 shows a timing diagram for some of the signals of the pulse generators of FIG. 3 during a normal mode, according to some embodiments described herein.

The elements of pulse generators 151 and 152 shown in FIG. 3 allow signals CKn1, CKn2, Znet, CKs1, and CKs2 to have waveforms (e.g., timing waveforms) shown in FIG. 4 and FIG. 5.

FIG. 4 shows a timing diagram for some of the signals pulse generators 151 and 152 of FIG. 3 during a test mode of apparatus 100, according to some embodiments described herein. As shown in FIG. 4, clock signal CLK can have a duty cycle of 50%. Each of signals CKn1 and CKs1 can have a duty cycle different from 50%. Signals CKn2 and CKs2 are complements of signals CKn1 and CKs1, respectively.

Signal SCAN* can have a value (e.g., "0") corresponding to level (e.g., voltage level) 470, and a value (e.g., "1") corresponding to signal level (e.g., voltage level) 471. As described above, apparatus 100 can be placed in a test mode when SCAN*="0" and a normal mode when SCAN*="1". FIG. 4 shows example waveforms of signals CLK, SCAN*, CKn1, CKn2, Znet, CKs1, and CKs2 during a test mode of apparatus 100 (which can be performed during a time interval where signal SCAN* has signal level 470).

The waveforms signals of CKn1, CKn2, Znet, CKs1, and CKs2 as shown in FIG. 4 can allow latches 111-114 to properly pass information Dscan through latches 111-114 (e.g., through the scan chain) during a test mode of apparatus 100. The waveforms signals of CKn1, CKn2, Znet, CKs1, and CKs2 as shown in FIG. 4 can also allow latches 111-114 to avoid minimum-delay failures in the chain (e.g., scan chain) formed by latches 111-114 during a test mode.

FIG. 5 shows a timing diagram for some of the signals of pulse generators 151 and 152 of FIG. 3 during a normal mode of apparatus 100, according to some embodiments described herein. The waveforms of signals CLK, CKn1, CKn2, and Znet shown FIG. 5 can be similar to or identical to those of the signals shown in FIG. 4. However, signals SCAN*, CKs1, and CKs2 in FIG. 5 are different from signals SCAN*, CKs1, and CKs2 of FIG. 4. For example, FIG. 5 shows an example waveforms of signal CLK, SCAN*, CKn1, CKn2, Znet, CKs1, and CKs2 during a normal mode of apparatus 100 (which can be performed during a time interval where signal SCAN* has signal level 471). As shown in FIG. 5, during the normal mode, signals CKs1 and CKs2 can be deactivated, such that each of signals CKs1 and CKs2 can remain at the same value (e.g., same level) during the normal mode. The waveforms of signals CKn1, CKn2, Znet, CKs1, and CKs2 as shown in FIG. 5 can allow latches 111-114 to properly pass information Din1, Din2, Din3, and Din4 from respective input nodes to respective output nodes of latches 111-114 during a normal mode of apparatus 100. Since signals CKs1 and CKs2 are deactivated during the normal mode as shown in FIG. 5, circuits 222, 223, and 224 consume no or minimal active power during the normal mode. This can improve (e.g., reduce) power consumption of latches 111-114 during the normal mode.

The structures and operations of apparatus 100 as described above with reference to FIG. 1 through FIG. 5 allows apparatus 100 to have improvements and benefits in comparison to some conventional techniques. For example, some conventional sequential cells (e.g., flip-flops) may include master and slave latches and a clock signal similar to or the same as signal CLK (FIG. 1) is used as timing signal for the master and slave latches. In comparison with such conventional sequential cells, latches 111-114 have a different structure and use signals (e.g., signals CKn1, CKn2, CKs1, and CKs2) other than clock signal CLK as timing signals. The structure and the use of signals CKn1, CKn2, CKs1, and CKs2 as described above with reference to FIG. 1 through FIG. 5 allow latches 111-114 to have lower power consumption in comparison with some conventional sequential cells. Further, the inclusion of circuits 222, 223, and 224 in latches 122, 123, and 124, respectively, allow latches 111-114 to avoid minimum-delay failures in the chain (e.g., scan chain) formed by latches 111-114 during a test mode.

Circuits 222, 223, and 224 also consume no or minimal active power during the normal mode of apparatus 100. These differences mentioned herein allow latches 111-114 and apparatus 100 to consume a relatively lower power (e.g., less active clock power) and potentially help improve performance (e.g., increase frequency) over some of the conventional sequential cells.

Figure 6:
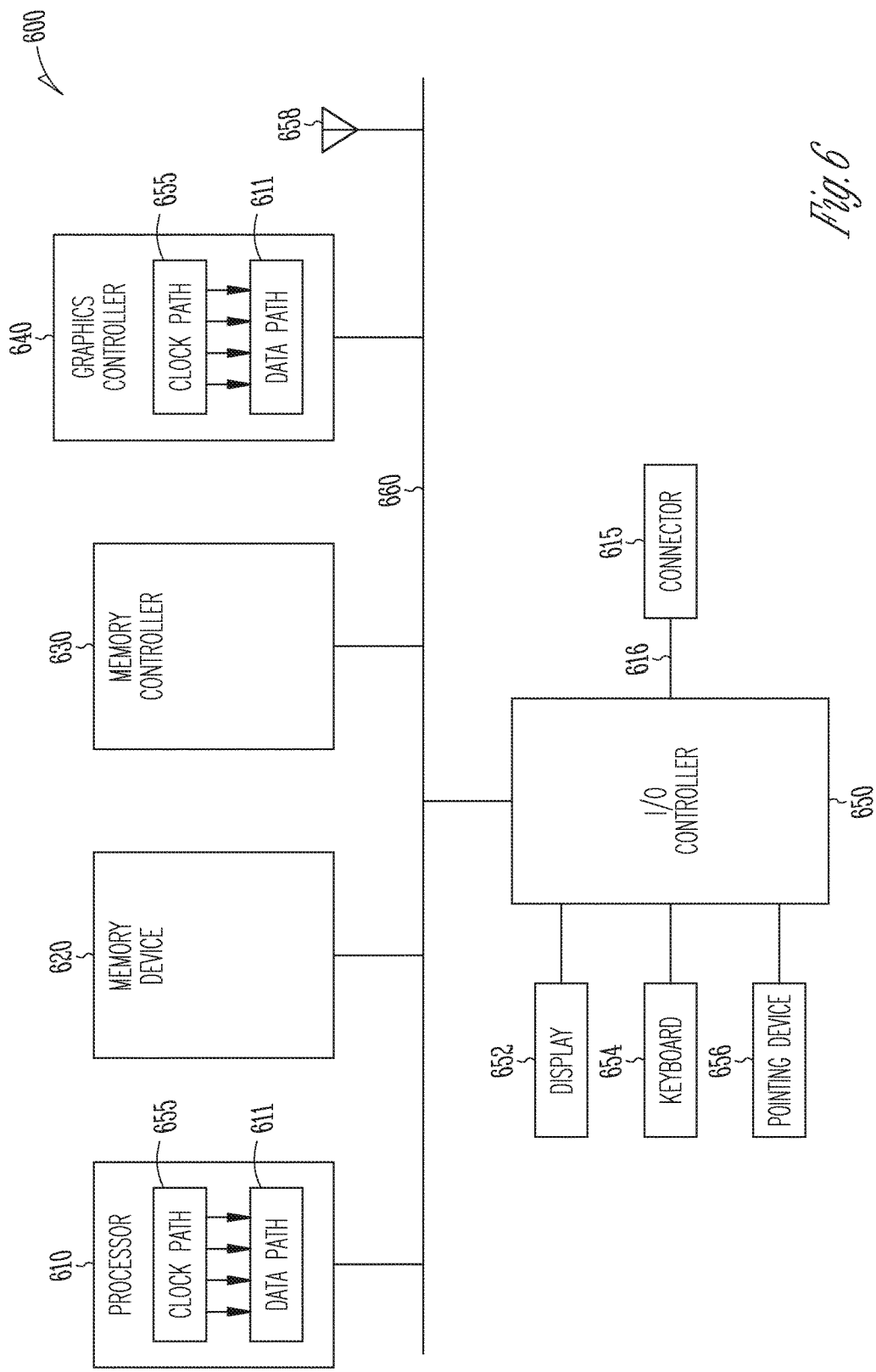
FIG. 6 shows an apparatus in the form of a system (e.g, electronic system), according to some embodiments described herein.

FIG. 6 shows an apparatus in the form of a system (e.g., electronic system) 600, according to some embodiments described herein. System 600 can include or be included in a computer, a tablet, or other electronic systems. As shown in FIG. 6, system 600 can include a processor 610, a memory device 620, a memory controller 630, a graphics controller 640, an input/output (I/O) controller 650, a display 652, a keyboard 654, a pointing device 656, at least one antenna 658, a connector 615, and a bus 660 (e.g., conductive lines formed on a circuit board (not shown) of system 600).

Each of processor 610, memory device 620, memory controller 630, graphics controller 640, and I/O controller 650 can include an IC (integrated circuit) chip, or many of these components can be on the same IC chip (e.g., a system-on-chip or SOC).

In some arrangements, system 600 does not have to include a display. Thus, display 652 can be omitted from system 600. In some arrangements, system 600 does not have to include any antenna. Thus, antenna 658 can be omitted from system 600.

Processor 610 can include a general-purpose processor or an application specific integrated circuit (ASIC). Processor 610 can include a central processing unit (CPU).

Graphic controller 640 can include a graphics processor, which can include a graphics processing unit (GPU).

Memory device 620 can include a dynamic random-access memory (DRAM) device, a static random-access memory (SRAM) device, a flash memory device, phase change memory, a combination of these memory devices, or other types of memory. FIG. 6 shows an example where memory device 620 is a stand-alone memory device separated from processor 610. In an alternative arrangement, memory device 620 and processor 610 can be located on the same die. In such an alternative arrangement, memory device 620 is an embedded memory in processor 610, such as embedded DRAM (eDRAM), embedded SRAM (eSRAM), embedded non-volatile memory (embedded flash memory), or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antennas 658). Such wireless communication may include communication in accordance with WiFi communication technique, a Long-Term Evolution Advanced (LTE-A) communication technique, or other communication techniques.

I/O controller 650 can also include a module to allow system 600 to communicate with other devices or systems in accordance with one or more of standards or specifications (e.g., I/O standards or specifications), including Universal Serial Bus (USB), Display Port (DP), High-Definition Multimedia Interface (HDMI), Thunderbolt, Peripheral Component Interconnect Express (PCIe), Ethernet, and other specifications.

Connector 615 can be arranged (e.g., can include terminals, such as pins) to allow system 600 to be coupled to an external device (or system). This may allow system 600 to communicate (e.g., exchange information) with such a device (or system) through connector 615. Connector 615 may be coupled to I/O controller 650 through a connection 616 (e.g., a bus).

Connector 615, connection 616, and at least a portion of bus 660 can include elements (e.g., conductive terminals, conductive lines, or other conductive elements) that conform with at least one of USB, DP, HDMI, Thunderbolt, PCIe, Ethernet, and other specifications.

FIG. 6 shows the elements (e.g., devices and controllers) of system 600 arranged separately from each other as an example. For example, each of processor 610, memory device 620, memory controller 630, graphics controller 640, and I/O controller 650 can be located on a separate IC chip (e.g., separate semiconductor die). In some arrangements, two or more elements (e.g., processor 610, memory device 620, graphics controller 640, and I/O controller 650) of system 600 can be located on the same die (e.g., same IC chip) that can form a system-on-chip.

One or more of processor 610, memory device 620, memory controller 630, graphics controller 640, and I/O controller 650 can include the sequential cells described above with reference to FIG. 1 through FIG. 5. As an example, FIG. 6 shows each of processor 610 and graphics controller 640 including a data path 611 and a clock path 655. Data path 611 can include a multi-bit pulsed latch (e.g., latches 111-114), conductive connections 121, 122, and 123, and functional units 131 and 132 described above with reference to FIG. 1 through FIG. 5. Clock path 655 can include pulse generators 151 and 152 described above with reference to FIG. 1 through FIG. 5. Thus, data path 611 and clock path 655 shown in FIG. 6 can perform operations similar to (or the same as) the operations of latches 111-114 and pulse generators 151 and 152 described above with reference to FIG. 1 through FIG. 5. Although not shown in FIG. 6, one or more of memory device 620, memory controller 630, and I/O controller 650 can include a data path and a clock path similar to or identical to data path 611 and clock path 655 of processor 610 or graphics controller 640. Thus, at least part of system 600 can be placed in a test mode and clock path 611 and data path 655 of processor 610, graphics controller 640, or other components of system 600 can be tested after manufacturing.

The illustrations of the apparatuses (e.g., apparatus 100 and system 600) and methods (e.g., operations of apparatus 100 including operation of latches 111-114 and pulse generators 151 and 152, and the operation of system 600) described above with reference to FIG. 1 through FIG. 6 are intended to provide a general understanding of the structure of different embodiments and are not intended to provide a complete description of all the elements and features of an apparatus that might make use of the structures described herein.

The apparatuses (e.g., apparatus 100 and system 600) described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g, heart monitor, blood pressure monitor, etc.), set-top boxes, smart cards, Internet of Thing (IOT) devices, and others.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

ADDITIONAL NOTES AND EXAMPLES

Example 1 includes subject matter (such as a device, an electronic apparatus (e.g, circuit, electronic system, or both), or a machine) including a plurality of latches, each of the latches including a first input node to receive first information during a first mode of the apparatus, a second input node to receive second information during a second mode of the apparatus, a first clock node to receive a first signal, a second clock node to receive a second signal, a third clock node to receive a third signal, and a fourth clock node to receive a fourth signal, a first conductive connection coupled between an output node of a first latch among the latches and the first input node of a second latch among the latches, a second conductive connection coupled between an output node of the second latch and the first input node of a third latch among the latches, and a third conductive connection coupled between an output node of the third latch and the first input node of a fourth latch among the latches.

In Example 2, the subject matter of Example 1 may optionally include, wherein at least one of the first, second, third, and fourth signals has a duty cycle less than fifty percent.

In Example 3, the subject matter of Example 1 may optionally include, wherein the first mode includes a test mode of the apparatus.

In Example 4, the subject matter of Example 1 may optionally include, wherein the second latch includes a first stage coupled to the first and second input nodes of the second latch, and a second stage coupled between the first stage and the output node of the second latch, and the first stage is coupled to the third and fourth clock nodes of the second latch to receive the third and fourth signals, and the third latch includes a first stage coupled to the first and second input nodes of the third latch, and a second stage coupled between the first stage of the third latch and the output node of the third latch, and the first stage of the third latch is coupled to the third and fourth clock nodes of the third latch to receive the third and fourth signals.

In Example 5, the subject matter of Example 4 may optionally include, wherein the second stage of the second latch is coupled to the first and second clock nodes of the second latch to receive the first and second signals, and the second stage of the third latch is coupled to the first and second clock nodes of the third latch to receive the first and second signals.

In Example 6, the subject matter of Example 1 may optionally include, wherein the first, second, third, and fourth signals are activated during the first mode, and the third and fourth signals are deactivated during the second mode.

In Example 7, the subject matter of Example 6 may optionally include, wherein the second and fourth signals are non-overlapping signals.

In Example 8, the subject matter of Example 6 may optionally include, wherein the first and second signals are generated based on a clock signal, and the third and fourth signals are generated based on the second signal.

In Example 9, the subject matter of Example 1 may optionally include, wherein the first and second signals are complementary signals.

In Example 10, the subject matter of Example 9 may optionally include, wherein the third and fourth signals are complementary signals.

Example 11 includes subject matter (such as a device, an electronic apparatus (e.g, circuit, electronic system, or both), or a machine) including a first latch, a second latch, a third latch, and a fourth latch, each of the first, second, third, and fourth latches including a first stage and a second stage coupled to the first stage, the first stage including a first data input node, and a second data input node, and each of the first and second stages including clock nodes, a first conductive connection coupled between the second stage of the first latch and the first stage of the second latch, a second conductive connection coupled between the second stage of the second latch and the first stage of the third latch, a third conductive connection coupled between the second stage of the third latch and the first stage of the fourth latch, a first pulse generator including output nodes coupled to the clock nodes of the second stage, and a second pulse generator including output nodes coupled to the clock nodes of the first stage.

In Example 12, the subject matter of Example 11 may optionally include, wherein the first pulse generator is to generate a first signal and a second signal based on a clock signal, the second signal having a duty cycle less than fifty percent.

In Example 13, the subject matter of Example 12 may optionally include, wherein the second pulse generator is to generate a third signal and a fourth signal based on the second signal.

In Example 14, the subject matter of Example 11 may optionally include, wherein the first and second pulse generators are to be activated during a first mode of the apparatus, and the second pulse generator is to be deactivated during the second mode of the apparatus.

In Example 15, the subject matter of Example 14 may optionally include, wherein the first stage of each of the first, second, third, and fourth latches includes an inverter coupled to a transmission gate of a respective second stage of the first, second, third, and fourth latches.

In Example 16, the subject matter of Example 11 may optionally include, wherein the first stage of each of the first, second, third, and fourth latches include a multiplexer coupled to the first and second data input nodes.

Example 17 includes subject matter (such as a device, an electronic apparatus (e.g, circuit, electronic system, or both), or a machine) including a memory device, and a graphics process or coupled to the memory device, the graphics processor including a plurality of latches, each of the latches including a first input node to receive first information during a first mode of the apparatus, and a second input node to receive second information during a second mode of the apparatus, a first clock node to receive a first signal, a second clock node to receive a second signal, a third clock node to receive a third signal, and a fourth clock node to receive a fourth signal, a first conductive connection coupled between an output node of a first latch among the latches and the first input node of a second latch among the latches, a second conductive connection coupled between an output node of the second latch and the first input node of a third latch among the latches, and a third conductive connection coupled between an output node of the third latch and the first input node of a fourth latch among the latches.

In Example 18, the subject matter of Example 17 may optionally include, wherein further comprising a connector coupled to the graphics processor, the connector conforming with one of Universal Serial Bus (USB), High-Definition Multimedia Interface (HDMI), Thunderbolt, Peripheral Component Interconnect Express (PCIe), and Ethernet specifications.

In Example 19, the subject matter of Example 17 may optionally include, wherein further comprising an antenna coupled to the graphics processor.

In Example 20, the subject matter of Example 17 may optionally include, wherein further comprising a display coupled to the graphics processor.

The subject matter of Example 1 through Example 20 may be combined in any combination.

The above description and the drawings illustrate some embodiments to enable those skilled in the art to practice the embodiments of the inventive subject matter described herein. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a plurality of latches, each of the latches including a first input node to receive first information during a first mode of the apparatus, a second input node to receive second information during a second mode of the apparatus, a first clock node to receive a first signal, a second clock node to receive a second signal, a third clock node to receive a third signal, and a fourth clock node to receive a fourth signal;
a first conductive connection coupled between an output node of a first latch among the latches and the first input node of a second latch among the latches;
a second conductive connection coupled between an output node of the second latch and the first input node of a third latch among the latches; and
a third conductive connection coupled between an output node of the third latch and the first input node of a fourth latch among the latches.

2. The apparatus of claim 1, wherein at least one of the first, second, third, and fourth signals has a duty cycle less than fifty percent.

3. The apparatus of claim 1, wherein the first mode includes a test mode of the apparatus.

4. The apparatus of claim 1, wherein:
the second latch includes a first stage coupled to the first and second input nodes of the second latch, and a second stage coupled between the first stage and the output node of the second latch, and the first stage is coupled to the third and fourth clock nodes of the second latch to receive the third and fourth signals; and
the third latch includes a first stage coupled to the first and second input nodes of the third latch, and a second stage coupled between the first stage of the third latch and the output node of the third latch, and the first stage of the third latch is coupled to the third and fourth clock nodes of the third latch to receive the third and fourth signals.

5. The apparatus of claim 4, wherein:
the second stage of the second latch is coupled to the first and second clock nodes of the second latch to receive the first and second signals; and
the second stage of the third latch is coupled to the first and second clock nodes of the third latch to receive the first and second signals.

6. The apparatus of claim 1, wherein the first, second, third, and fourth signals are activated during the first mode, and the third and fourth signals are deactivated during the second mode.

7. The apparatus of claim 6, wherein the second and fourth signals are non-overlapping signals.

8. The apparatus of claim 6, wherein the first and second signals are generated based on a clock signal, and the third and fourth signals are generated based on the second signal.

9. The apparatus of claim 1, wherein the first and second signals are complementary signals.

10. The apparatus of claim 9, wherein the third and fourth signals are complementary signals.

11. An apparatus comprising:
a first latch, a second latch, a third latch, and a fourth latch, each of the first, second, third, and fourth latches including a first stage and a second stage coupled to the first stage, the first stage including a first data input node, and a second data input node, and each of the first and second stages including clock nodes;
a first conductive connection coupled between the second stage of the first latch and the first stage of the second latch;
a second conductive connection coupled between the second stage of the second latch and the first stage of the third latch;
a third conductive connection coupled between the second stage of the third latch and the first stage of the fourth latch;
a first pulse generator including output nodes coupled to the clock nodes of the second stage; and
a second pulse generator including output nodes coupled to the clock nodes of the first stage, wherein the first pulse generator is to generate a first signal and a second signal based on a clock signal, the second signal having a duty cycle less than fifty percent.

12. The apparatus of claim 11, wherein the second pulse generator is to generate a third signal and a fourth signal based on the second signal.

13. An apparatus comprising:
a first latch, a second latch, a third latch, and a fourth latch, each of the first, second, third, and fourth latches including a first stage and a second stage coupled to the first stage, the first stage including a first data input node, and a second data input node, and each of the first and second stages including clock nodes;
a first conductive connection coupled between the second stage of the first latch and the first stage of the second latch;
a second conductive connection coupled between the second stage of the second latch and the first stage of the third latch;
a third conductive connection coupled between the second stage of the third latch and the first stage of the fourth latch;
a first pulse generator including output nodes coupled to the clock nodes of the second stage; and
a second pulse generator including output nodes coupled to the clock nodes of the first stage, wherein the first and second pulse generators are to be activated during a first mode of the apparatus, and the second pulse generator is to be deactivated during the second mode of the apparatus.

14. The apparatus of claim 13, wherein the first stage of each of the first, second, third, and fourth latches includes an inverter coupled to a transmission gate of a respective second stage of the first, second, third, and fourth latches.

15. An apparatus comprising:
a first latch, a second latch, a third latch, and a fourth latch, each of the first, second, third, and fourth latches including a first stage and a second stage coupled to the first stage, the first stage including a first data input node, and a second data input node, and each of the first and second stages including clock nodes;
a first conductive connection coupled between the second stage of the first latch and the first stage of the second latch;
a second conductive connection coupled between the second stage of the second latch and the first stage of the third latch;
a third conductive connection coupled between the second stage of the third latch and the first stage of the fourth latch;
a first pulse generator including output nodes coupled to the clock nodes of the second stage; and
a second pulse generator including output nodes coupled to the clock nodes of the first stage, wherein the first stage of each of the first, second, third, and fourth latches include a multiplexer coupled to the first and second data input nodes.

16. An apparatus comprising:
a memory device; and
a graphics processor coupled to the memory device, the graphics processor including:
a plurality of latches, each of the latches including a first input node to receive first information during a first mode of the apparatus, and a second input node to receive second information during a second mode of the apparatus, a first clock node to receive a first signal, a second clock node to receive a second signal, a third clock node to receive a third signal, and a fourth clock node to receive a fourth signal;
a first conductive connection coupled between an output node of a first latch among the latches and the first input node of a second latch among the latches;
a second conductive connection coupled between an output node of the second latch and the first input node of a third latch among the latches; and
a third conductive connection coupled between an output node of the third latch and the first input node of a fourth latch among the latches.

17. The apparatus of claim 16, further comprising a connector coupled to the graphics processor, the connector conforming with one of Universal Serial Bus (USB), High-Definition Multimedia Interface (HDMI), Thunderbolt, Peripheral Component Interconnect Express (PCIe), and Ethernet specifications.

18. The electronic system of claim 16, further comprising an antenna coupled to the graphics processor.

19. The electronic system of claim 16, further comprising a display coupled to the graphics processor.

* * * * *